(12) United States Patent
Yim et al.

(10) Patent No.: US 9,159,914 B2
(45) Date of Patent: *Oct. 13, 2015

(54) NONVOLATILE MEMORY DEVICES AND METHODS OF FORMING THE SAME

(71) Applicant: Samsung Electronics Co., LTD., Suwon-si (KR)

(72) Inventors: Eun-Kyung Yim, Seoul (KR); In-Gyu Baek, Seoul (KR); Jang-Eun Lee, Suwon-si (KR); Se-Chung Oh, Suwon-si (KR); Kyung-Tae Nam, Suwon-si (KR); Jin-Shi Zhao, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/136,522

(22) Filed: Dec. 20, 2013

(65) Prior Publication Data

US 2014/0124727 A1 May 8, 2014

Related U.S. Application Data

(63) Continuation of application No. 12/070,219, filed on Feb. 15, 2008, now Pat. No. 8,614,125.

(30) Foreign Application Priority Data

Feb. 16, 2007 (KR) .................. 10-2007-0016453

(51) Int. Cl.
*H01L 27/108* (2006.01)
*H01L 27/112* (2006.01)
(Continued)

(52) U.S. Cl.
CPC ........ *H01L 45/1253* (2013.01); *H01L 27/2409* (2013.01); *H01L 27/2436* (2013.01); *H01L 27/2463* (2013.01); *H01L 45/085* (2013.01); *H01L 45/1233* (2013.01);
(Continued)

(58) Field of Classification Search
CPC .................. G11C 13/0014; H01L 21/8239
See application file for complete search history.

(56) References Cited

U.S. PATENT DOCUMENTS

| 4,492,743 A | 1/1985 | Howe |
| 6,834,008 B2 | 12/2004 | Rinerson et al. |
| 6,849,891 B1 | 2/2005 | Hsu et al. |

(Continued)

FOREIGN PATENT DOCUMENTS

| JP | 10340893 | 12/1998 |
| JP | 2005123361 | 5/2005 |

(Continued)

OTHER PUBLICATIONS

"Nonvolatile Memory Devices and Methods of forming the same", specification, drawings, claims and Prosecution History of U.S. Appl. No. 12/070,219, filed Feb. 15, 2008 by Eun-Kyung Kim et. al.

*Primary Examiner* — Mohammad Choudhry
(74) *Attorney, Agent, or Firm* — Onello & Mello, LLP

(57) ABSTRACT

A nonvolatile memory device includes a bottom electrode on a semiconductor substrate, a data storage layer on the bottom electrode, the data storage layer including a transition metal oxide, and a switching layer provided on a top surface and/or a bottom surface of the data storage layer, wherein a bond energy of material included in the switching layer and oxygen is more than a bond energy of a transition metal in the transition metal oxide and oxygen.

16 Claims, 9 Drawing Sheets

(51) Int. Cl.
*H01L 45/00* (2006.01)
*H01L 27/24* (2006.01)

(52) U.S. Cl.
CPC ......... *H01L 45/1266* (2013.01); *H01L 45/145* (2013.01); *H01L 45/146* (2013.01)

(56) References Cited

U.S. PATENT DOCUMENTS

| | | | |
|---|---|---|---|
| 7,166,886 | B2 | 1/2007 | Forbes |
| 7,498,600 | B2 | 3/2009 | Cho et al. |
| 7,518,213 | B2 | 4/2009 | Bae et al. |
| 7,521,704 | B2 | 4/2009 | Lee et al. |
| 8,614,125 | B2 * | 12/2013 | Yim et al. .................... 438/257 |
| 2004/0130939 | A1 | 7/2004 | Morikawa |
| 2005/0151277 | A1 | 7/2005 | Kawazoe et al. |
| 2005/0191804 | A1 | 9/2005 | Lai et al. |
| 2005/0247921 | A1 | 11/2005 | Lee et al. |
| 2006/0054950 | A1 | 3/2006 | Baek et al. |
| 2006/0098472 | A1 | 5/2006 | Ahn et al. |
| 2006/0226411 | A1 | 10/2006 | Lee |
| 2007/0018219 | A1 | 1/2007 | Lim et al. |
| 2007/0120580 | A1 | 5/2007 | Kim et al. |
| 2007/0159868 | A1 | 7/2007 | Sugita et al. |
| 2008/0048165 | A1 | 2/2008 | Miyazawa |
| 2008/0106927 | A1 | 5/2008 | Celinska et al. |
| 2008/0197336 | A1 | 8/2008 | Yim et al. |
| 2008/0211036 | A1 | 9/2008 | Zhao et al. |
| 2008/0273370 | A1 | 11/2008 | Keller et al. |
| 2009/0039332 | A1 | 2/2009 | Lee et al. |

FOREIGN PATENT DOCUMENTS

| | | |
|---|---|---|
| JP | 2005317976 | 11/2005 |
| JP | 2006140489 | 6/2006 |
| KR | 2005105297 | 11/2005 |
| KR | 2006023860 | 3/2006 |
| KR | 2006042734 | 5/2006 |
| KR | 2006106113 | 10/2006 |
| KR | 100668348 | 1/2007 |

* cited by examiner

NONVOLATILE MEMORY DEVICES AND METHODS OF FORMING THE SAME

CROSS-REFERENCE TO RELATED APPLICATION

This application is a continuation application of U.S. patent application Ser. No. 12/070,219, filed on Feb. 15, 2008 (now U.S. Pat. No. 8,614,125 B2), which claims priority under 35 U.S.C. §119 of Korean Patent Application No. 2007-16453, filed on Feb. 16, 2007, the entire contents of which are hereby incorporated by reference.

FIELD OF THE INVENTION

The present invention relates to semiconductor devices and methods of forming the same, for example, to nonvolatile memory devices and methods of forming the nonvolatile memory devices.

BACKGROUND

Generally, semiconductor memory devices are classified into volatile semiconductor memory devices and nonvolatile semiconductor memory devices according to whether a power supply is required to maintain stored data. Volatile semiconductor memory devices, such as a dynamic random access memory (DRAM) device or a static random access memory (SRAM) device, operate at high speeds, and they require power supplies to maintain their stored data. On the other hand, nonvolatile semiconductor memory devices, such as a phase changeable random access memory (PRAM) device, a metal oxide resistive random access memory (RRAM) device, or a ferroelectric random access memory (FRAM) device, do not require a power supply to maintain their stored data.

The RRAM device may have a cell capacitor including a transition metal oxide instead of a dielectric layer of the DRAM cell capacitor. The resistance of the transition metal oxide can be changed according to a programmed voltage applied to top and bottom electrodes of the transition metal oxide. The resistivity of the transition metal oxide can change more than one hundred times depending on the magnitude of the programmed voltage, and the transition metal oxide can maintain the changed resistivity even when the programmed voltage is interrupted. Data stored in the transition metal oxide may be gathered to determine whether the data is logic "1" or logic "0" by sensing the change in voltage and current caused by a difference of the resistivity.

FIG. 1 is a cross-sectional view of a conventional nonvolatile memory device. FIGS. 2 through 4 are graphs illustrating a switching characteristic of a conventional nonvolatile memory device.

Referring to FIG. 1, a gate pattern 25 is disposed on a semiconductor substrate 10. The gate pattern 25 may include a gate insulating layer 22 and a gate electrode 24. Source and drain regions 12 and 14 are disposed in the substrate 10 adjacent to the gate pattern 25. A first insulating interlayer 20 is disposed on the substrate 10 to cover the gate pattern 25. A contact plug 26 is disposed in the first insulating interlayer 20 and is connected to the drain region 14.

A bottom electrode 32 is disposed on the first insulating interlayer 20 and is connected to the contact plug 26. The bottom electrode 32 may include iridium (Ir). A data storage layer 34 is disposed on the bottom electrode 32. The data storage layer 34 may include nickel oxide (NiO). A top electrode 36 is disposed on the data storage layer 34. The top electrode 36 may include iridium (Ir). A second insulating interlayer 30 is disposed on the first insulating interlayer 20 to cover the top electrode 36. A plate electrode 40 is disposed on the second insulating interlayer 30 and is connected to the top electrode 36.

FIGS. 2 through 4 illustrate graphs obtained for a nonvolatile memory device in which the top and bottom electrodes include iridium (Ir) and the data storage layer 34 includes nickel oxide (NiO). FIG. 2 shows a set resistance and a reset resistance of the memory device having the transition metal oxide. FIG. 3 is a histogram showing a distribution of the set and reset resistances shown in FIG. 2. In FIG. 4, the horizontal axis shows the number of cycles of program and erase, and the vertical axis shows the set and reset resistances. In FIGS. 2 and 3, the range of the set and reset resistances is wide, and the difference between the set and reset resistances is almost one thousand times. The distribution of the set/reset resistances is not uniform. As a result, a conventional nonvolatile memory device may not provide a stable switching operation.

SUMMARY OF THE INVENTION

Exemplary embodiments of the present invention provide a nonvolatile memory device including: a bottom electrode on a semiconductor substrate; a data storage layer on the bottom electrode, the data storage layer including a transition metal oxide; and a switching layer provided on a top surface and/or a bottom surface of the data storage layer; wherein a bond energy of a material included in the switching layer and oxygen is more than a bond energy of a transition metal in the oxide and oxygen.

Other exemplary embodiments of the present invention provide a method of forming a nonvolatile memory device including: forming a switching layer, the switching layer being provided on a top surface and/or a bottom surface of the data storage layer; wherein a bond energy of a material included in the switching layer and oxygen is more than a bond energy of a transition metal in the oxide and oxygen.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
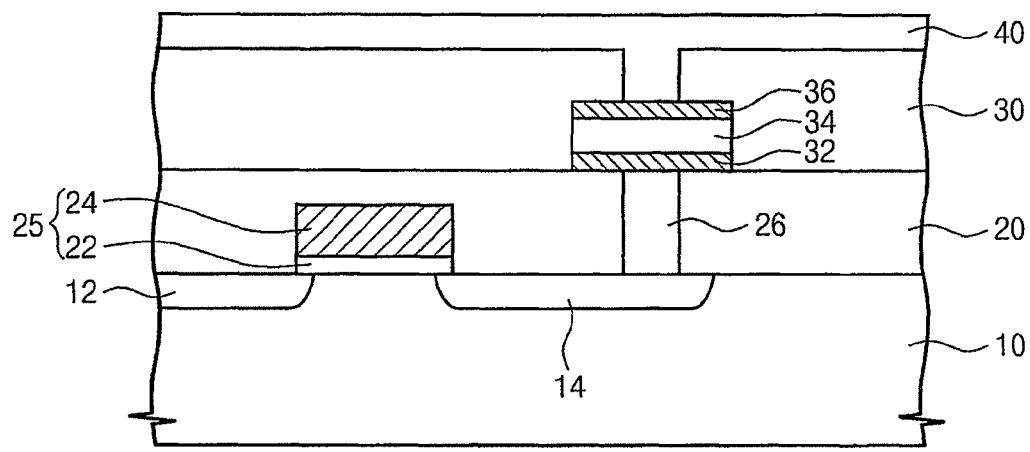
FIG. 1 is a cross-sectional view of a conventional nonvolatile memory device.
Figure 2:
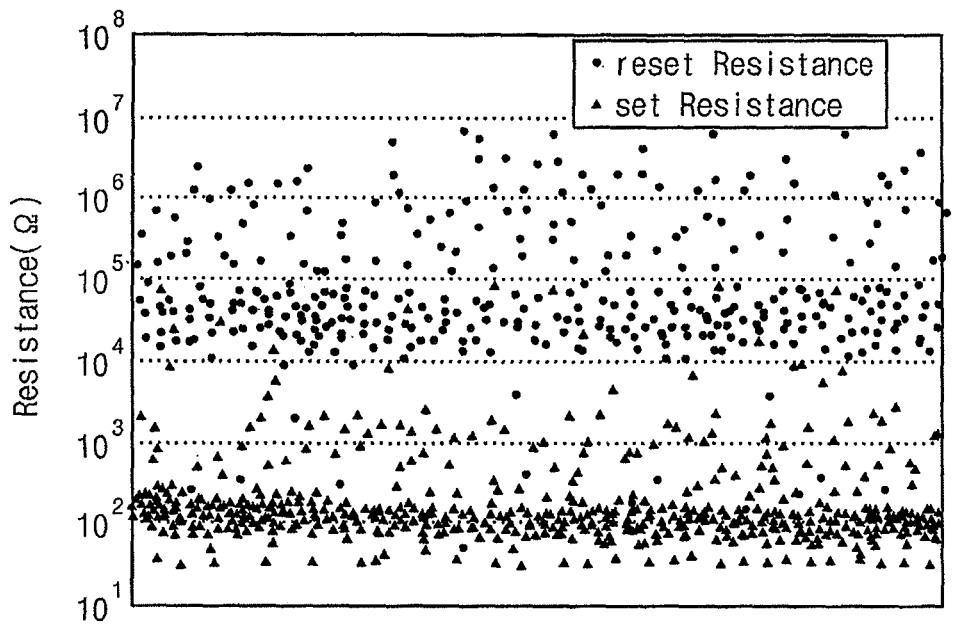
FIGS. 2 through 4 are graphs showing switching characteristics of a conventional nonvolatile memory device.
Figure 3:
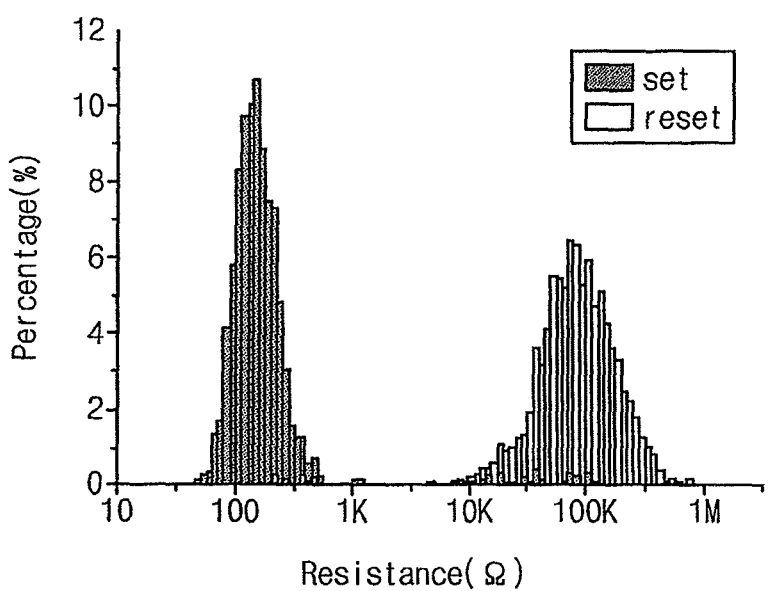
Figure 4:
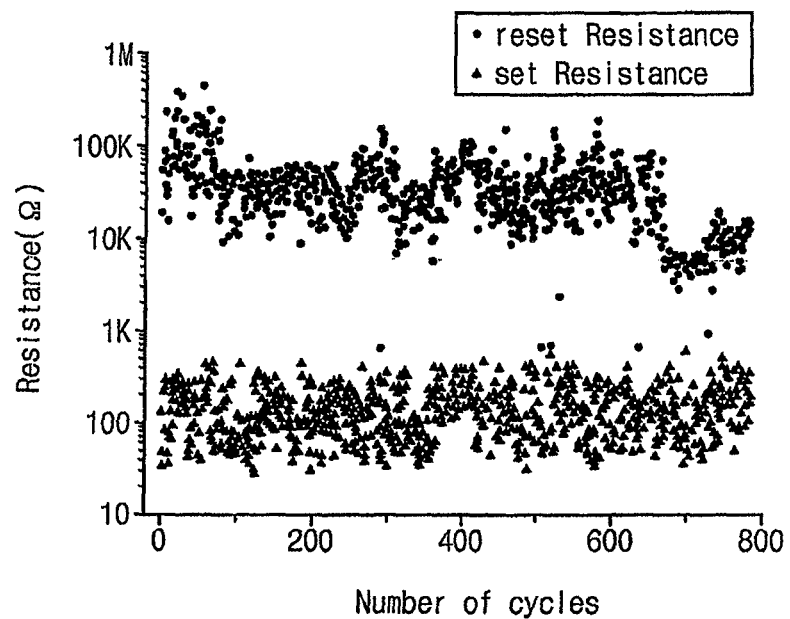

Embodiments of the present invention will now be described more fully with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

It will be understood that, although the terms "first", "second", "third" etc. may be used herein to describe various components, materials, etc. the components, materials, etc., should not be limited by these terms. These terms are only used to distinguish one portion from another portion. It will also be understood that when an element, such as a layer, region or substrate, is referred to as being "on" or "onto" another element, it may lie directly on the other element or intervening elements, such as layers, may also be present. In the drawings, the thicknesses of layers and regions are exaggerated for clarity. As used herein, the term "and/or" includes any and all combinations of one or more of the associated listed items. For example, the term "a conductive layer and/or an insulating layer" may include a conductive layer, an insulating layer, or a combination layer of a conductive layer and an insulating layer.

Figure 5:
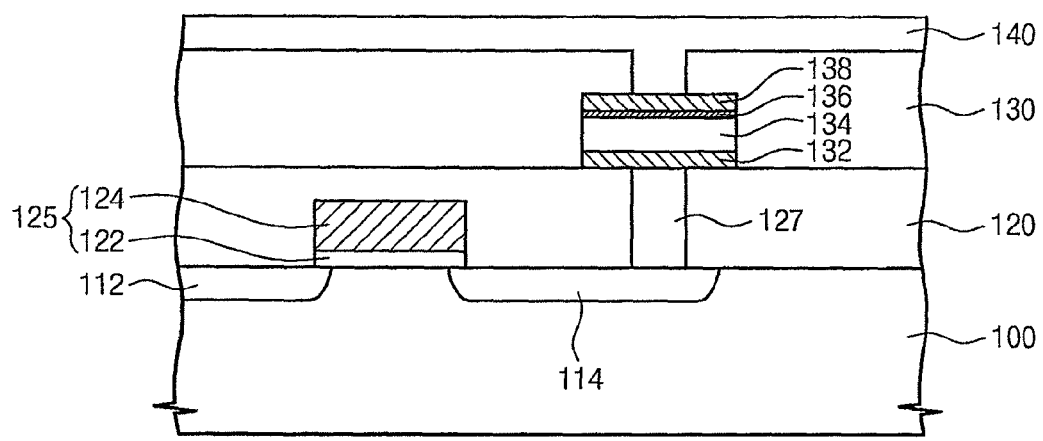
FIG. 5 is a cross-sectional view of a nonvolatile memory device in accordance with an embodiment of the present invention.

FIG. 5 is a cross-sectional view of a nonvolatile memory device in accordance with an embodiment of the present invention.

Referring to FIG. 5, a gate pattern 125 is disposed on a semiconductor substrate 100. The gate pattern 125 may include a gate insulating layer 122 and a gate electrode 124. The gate insulating layer 122 may include silicon oxide. The gate electrode 124 may include polysilicon. Source and drain regions 112 and 114 are disposed in the semiconductor substrate 100 adjacent to the gate pattern 125.

A first insulating interlayer 120 is disposed on the semiconductor substrate 100 to cover the gate pattern 125. A contact plug 127 is disposed in the first insulating interlayer 120 and is connected to the drain region 114. A bottom electrode 132 is disposed on the first insulating interlayer 120 and is connected to the contact plug 127. A data storage layer 134 is disposed on the bottom electrode 132. The data storage layer 134 may include a transition metal oxide. A switching layer 136 is provided in contact with the top surface of the data storage layer 134. The switching layer 136 may have a thickness of approximately 5 to approximately 20 angstroms. A top electrode 138 is disposed on the switching layer 136. A second insulating interlayer 130 is disposed on the first insulating interlayer 120 to cover the top electrode 138. A plate electrode 140 is disposed on the second insulating interlayer 130 and is connected to the top electrode 138.

The switching layer 136 may include one or more materials such as aluminum (Al), magnesium (Mg) and/or tantalum (Ta). The data storage layer 134 may include a transition metal oxide in which the transition metal is nickel (Ni), niobium (Nb), titanium (Ti), zirconium (Zr), hafnium (Hf), cobalt (Co), iron (Fe), copper (Cu), chromium (Cr), or zinc (Zn). The top and bottom electrodes 138 and 132 may independently include materials such as iridium (Ir), platinum (Pt), ruthenium (Ru), tungsten (W), titanium nitride (TiN) and/or polysilicon.

It is believed that the bond energy of the material included in the switching layer 136 and oxygen is more than that of the transition metal included in the data storage layer 134 and oxygen. For example, the bond energy of aluminum and oxygen is about 260 KJ/mol, while the bond energy of nickel and oxygen is about 24 kJ/mol. Thus, a portion of the material of the switching layer 136 may be bonded to oxygen on the top portion of the data storage layer 134. As a result, the transition metal that is not bonded to oxygen may be in the upper portion of the data storage layer 134. As an external electric field is applied to the data storage layer 134, a conductive filament may be generated or may disappear in the data storage layer 134. The conductive filament may be generated or may disappear regularly where the transition metal that is not bonded to oxygen in the top portion of the data storage layer 134 is. A range of set and reset resistances may be shortened by the switching layer 136. Thus, the switching characteristics of a nonvolatile memory device may be improved by providing the switching layer 136.

Figure 6:
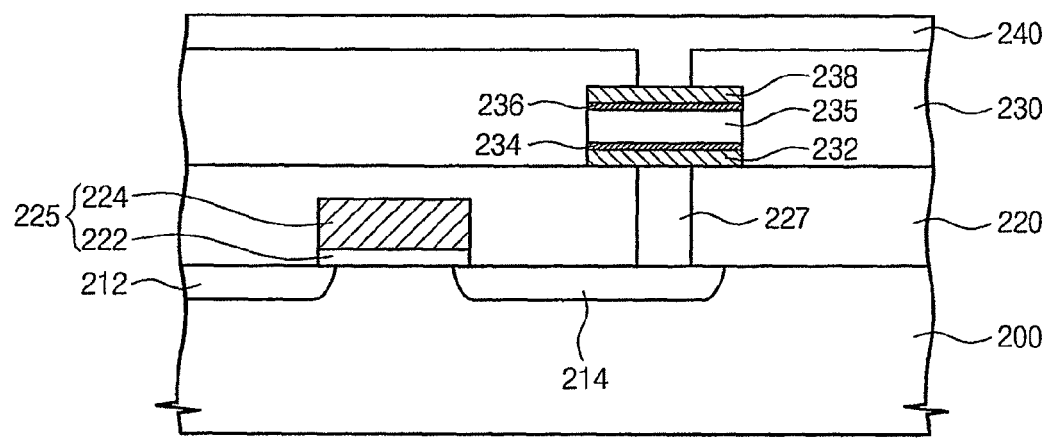
FIG. 6 is a cross-sectional view of a nonvolatile memory device in accordance with another embodiment of the present invention.

FIG. 6 is a cross-sectional view of a nonvolatile memory device in accordance with another embodiment of the present invention.

Referring to FIG. 6, a gate pattern 225 is disposed on a semiconductor substrate 200. The gate pattern 225 may include a gate insulating layer 222 and a gate electrode 224. The gate insulating layer 222 may include silicon oxide. The gate electrode 224 may include polysilicon. Source and drain regions 212 and 214 are disposed in the semiconductor substrate 200 adjacent to the gate pattern 225.

A first insulating interlayer 220 is disposed on the semiconductor substrate 200 to cover the gate pattern 225. A contact plug 227 is disposed in the first insulating interlayer 220 and is connected to the drain region 214. A bottom electrode 232 is disposed on the first insulating interlayer 220 and is connected to the contact plug 227. A first switching layer 234 is disposed on the bottom electrode 232. A data storage layer 235 is disposed on a top surface of the first switching layer 234. The data storage layer 235 may include a transition metal oxide. A second switching layer 236 is disposed on a top surface of the data storage layer 235. The first and second switching layers 234 and 236 may each have a thickness of approximately 5 to approximately 20 angstroms. A top electrode 238 is disposed on the second switching layer 236. A second insulating interlayer 230 is disposed on the first insulating interlayer 220 to cover the top electrode 238. A plate electrode 240 is disposed on the second insulating interlayer 230 and is connected to the top electrode 238. Alternatively, the first switching layer 234 may be disposed under a bottom surface of the data storage layer 235 and the second switching layer 236 may not be provided.

The first and second switching layers 234 and 236 may include one or more materials such as aluminum (Al), magnesium (Mg), and/or tantalum (Ta). The data storage layer 234 may include a transition metal oxide in which the transition metal is nickel (Ni), niobium (Nb), titanium (Ti), zirconium (Zr), hafnium (Hf), cobalt (Co), iron (Fe), copper (Cu), chromium (Cr), or zinc (Zn). The top and bottom electrodes 238 and 232 may independently include materials such as iridium (Ir), platinum (Pt), ruthenium (Ru), tungsten (W), titanium nitride (TiN) and/or polysilicon.

It is believed that the bond energy of the material included in the first switching layer 234 and the second switching layer 236 and oxygen is more than that of the transition metal included in the data storage layer 235 and oxygen. For example, the bond energy of aluminum and oxygen is about 260 KJ/mol, while the bond energy of nickel and oxygen is about 24 kJ/mol. Thus, a portion of the material of the first and second switching layers 234 and 236 may be bonded to oxygen on the top portion and on the bottom portion of the data storage layer 134. As a result, the transition metal that is not bonded to oxygen may be in an upper portion and in a lower portion of the data storage layer 134. As an external electric field is applied to the data storage layer 134, a conductive filament may be generated or may disappear in the data storage layer. The conductive filament may be generated or may disappear regularly where the transition metal that is not bonded to oxygen in the top and in the bottom portions of the data storage layer 134 is. A range of the set and reset resistances may be shortened by the first and second switching layer 234 and 236. Thus, the switching characteristics of a nonvolatile memory device may be improved by providing the first and second switching layers 234 and 236.

Figure 7:
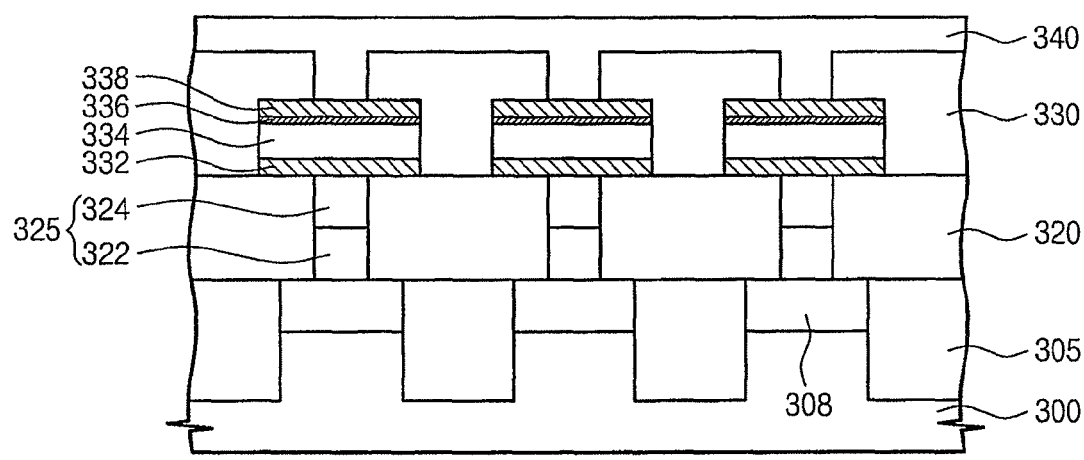
FIG. 7 is a cross-sectional view of a nonvolatile memory device in accordance with still another embodiment of the present invention.

FIG. 7 is a cross-sectional view of a nonvolatile memory device in accordance with still another embodiment of the present invention.

Referring to FIG. 7, a device isolation layer 305 is disposed in a semiconductor substrate 300 to define an active region. An impurity region 308 is disposed in the active region. A first insulating interlayer 320 is disposed on the semiconductor substrate 300. A diode 325 is disposed in the first insulating interlayer 320 and is connected to the impurity region 308. The diode 325 may include an n-type semiconductor 322 and a p-type semiconductor 324. A bottom electrode 332 is disposed on the first insulating interlayer 320 and is connected to the diode 325. A data storage layer 334 is disposed on the bottom electrode 332. A switching layer 336 is disposed on the data storage layer 334. A top electrode 338 is disposed on the switching layer 336. A second insulating interlayer 330 is disposed on the first insulating interlayer 320 to cover the top electrode 338. A plate electrode 340 is disposed on the second insulating interlayer 330 and is connected to the top electrode 338.

The switching layer 336 may include one or more materials such as aluminum (Al), magnesium (Mg), and/or tantalum (Ta). The data storage layer 334 may include a transition metal oxide in which the transition metal is nickel (Ni), niobium (Nb), titanium (Ti), zirconium (Zr), hafnium (Hf), cobalt (Co), iron (Fe), copper (Cu), chromium (Cr), and zinc (Zn). The top and bottom electrodes 338 and 332 may independently include materials such as iridium (Ir), platinum (Pt), ruthenium (Ru), tungsten (W), titanium nitride (TiN) and/or polysilicon.

It is believed that the bond energy of the material included in the switching layer 336 and oxygen is more than that of the transition metal included in the data storage layer 334 and oxygen. For example, the bond energy of aluminum and oxygen is about 260 KJ/mol, while the bond energy of nickel and oxygen is about 24 kJ/mol. Thus, a portion of the material included in the switching layer 336 may be bonded to oxygen in the top portion of the data storage layer 334. As a result, the transition metal that is not bonded to oxygen may be in the upper portion of the data storage layer 334. As an external electric field is applied to the data storage layer 334, a conductive filament may be generated or may disappear. The conductive filament may be generated or may disappear regularly where the transition metal that is not bonded to oxygen in the top portion of the data storage layer 334 is. A range of the set and reset resistances may be shortened by the switching layer 336. Thus, the switching characteristics of a nonvolatile memory device may be improved by providing the switching layer 336.

Figure 8:
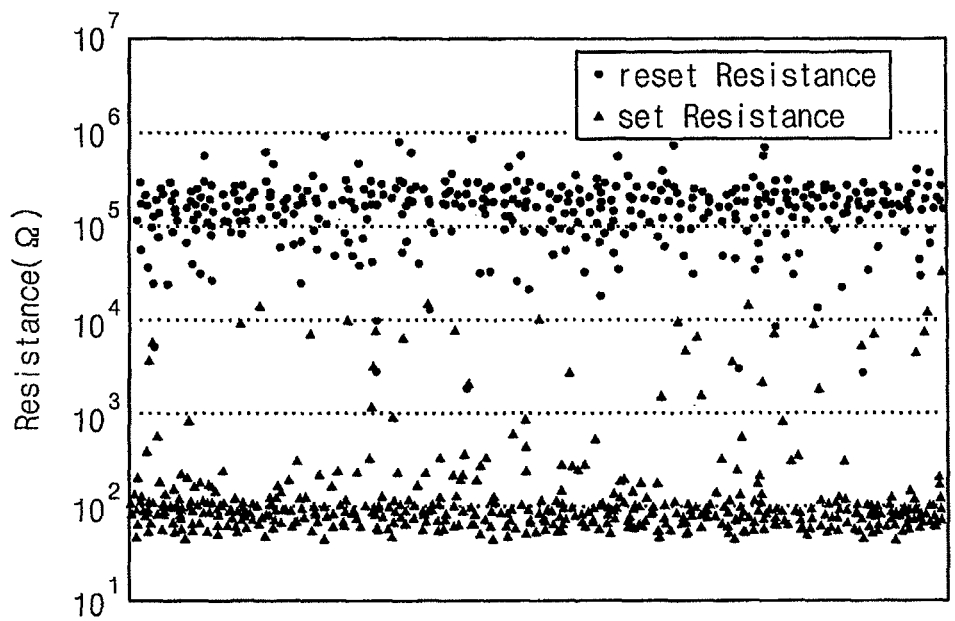
FIGS. 8 through 10 are graphs showing switching characteristics of a nonvolatile memory device in accordance with an embodiment of the present invention.
Figure 9:
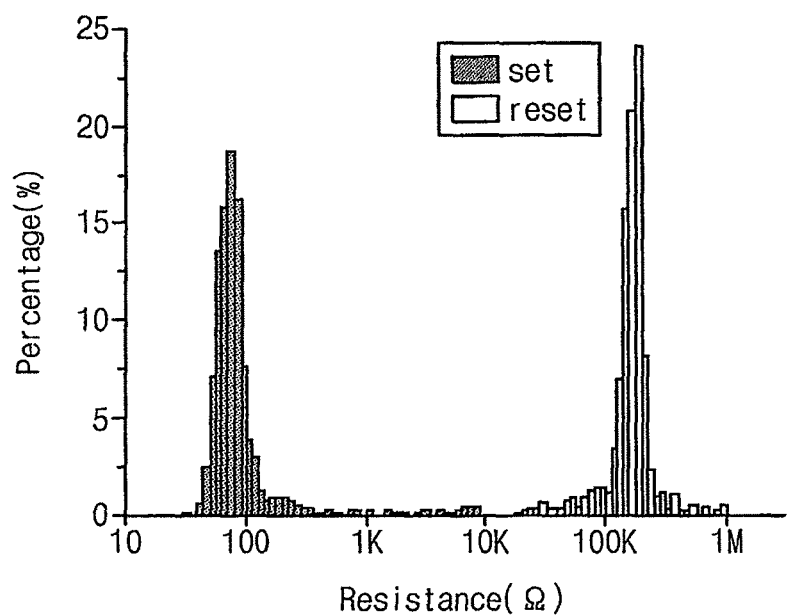
Figure 10:
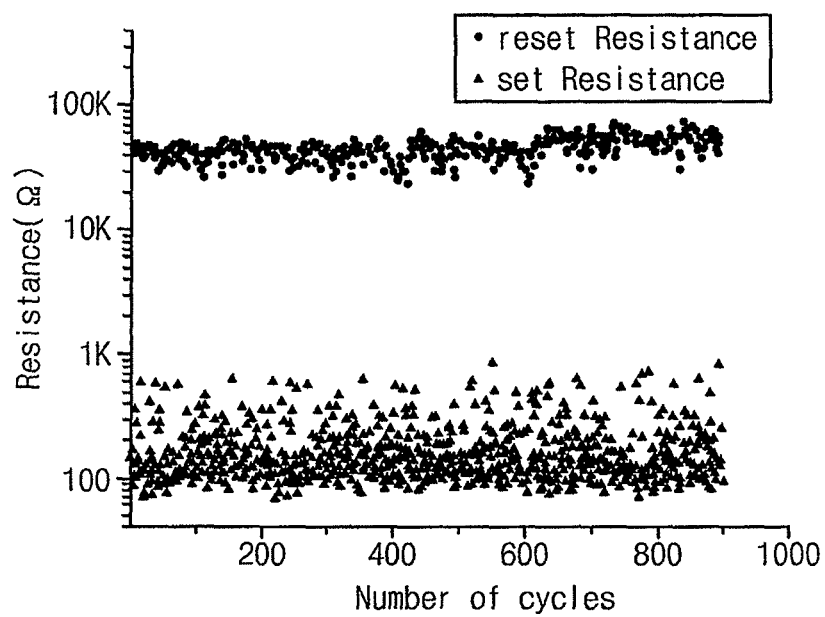

FIGS. 8 through 10 are graphs showing the switching characteristics of a nonvolatile memory device in accordance with an embodiment of the present invention.

FIG. 8 is a graph showing a set resistance and a reset resistance of a memory device having a switching layer. FIG. 9 is a histogram showing a distribution of the set and reset resistances of FIG. 8. FIG. 10 is a graph showing the set and reset resistances according to the number of cycles of program and erase obtained when the switching layer includes aluminum (Al) and the data storage layer includes nickel oxide (NiO). Referring to FIGS. 8 and 9, a difference (about 1000 times) between the set resistance and the reset resistance is maintained uniformly and the uniformity of the set and reset resistances is improved as compared with certain conventional devices. Referring to FIG. 10, even when the number of cycle of the set and reset reaches 1000, the set and reset resistances maintain their own initial values, and the uniformity of the set and reset resistances is improved as compared with certain conventional devices.

Figure 11A:
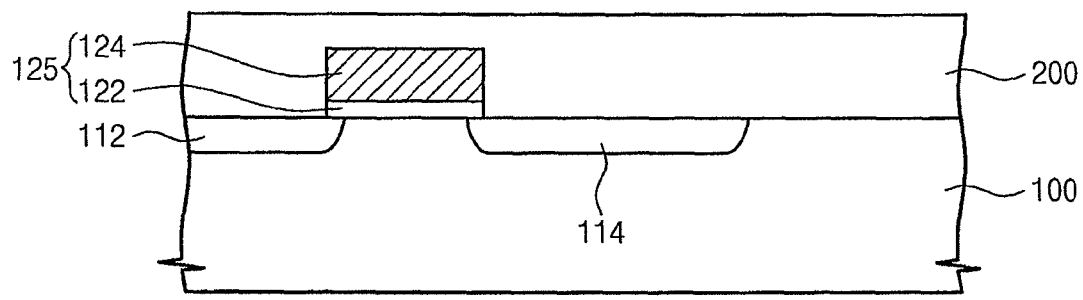
FIGS. 11a through 11c are cross-sectional views illustrating a method of forming a nonvolatile memory device in accordance with an embodiment of the present invention.
Figure 11B:
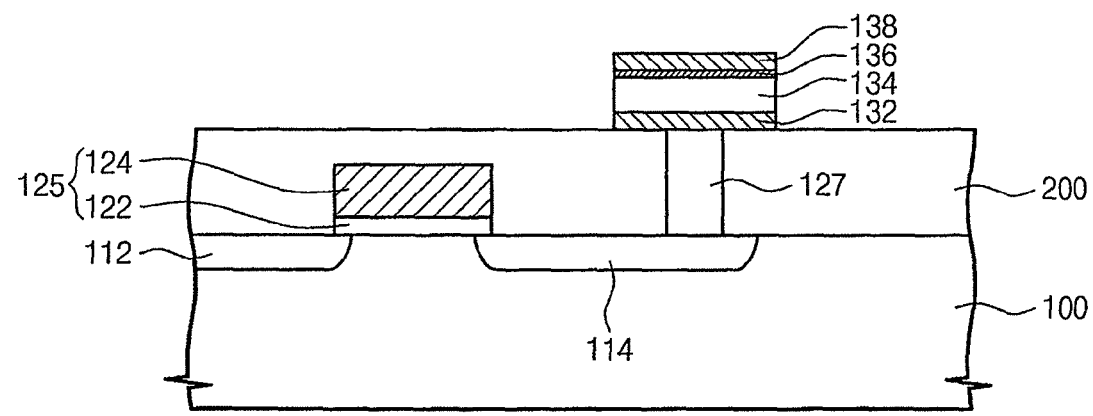
Figure 11C:
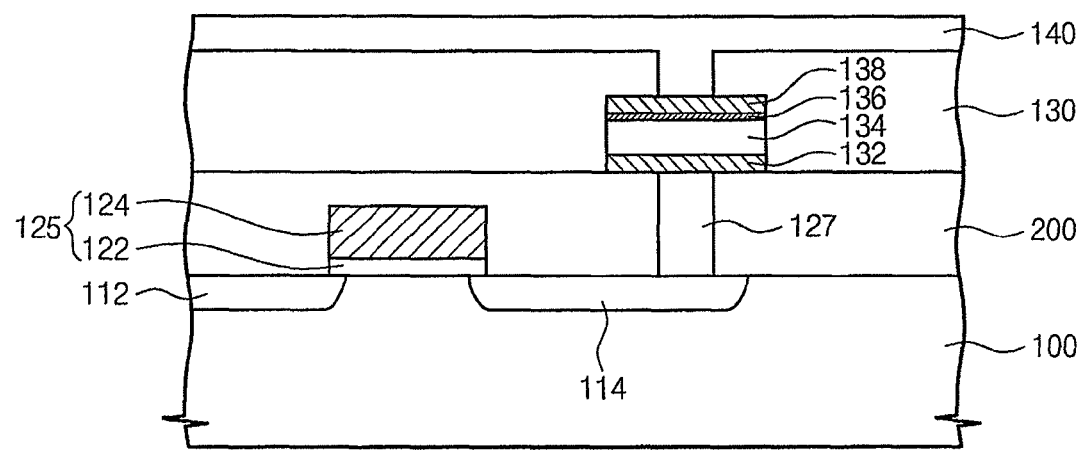

FIGS. 11a through 11c are cross-sectional views illustrating a method of forming a nonvolatile memory device in accordance with an embodiment of the present invention.

Referring to FIG. 11a, a gate pattern 125 is formed on a semiconductor substrate 100. The gate pattern 125 includes a gate insulating layer 122 and a gate electrode 124. The gate insulating layer 122 may be formed by means of a thermal oxidation process. An ion implantation process can be performed using the gate pattern 125 as a mask to form source and drain regions 112 and 114 in the substrate 100 adjacent to the gate pattern 125. A first insulating interlayer 200 is formed on the substrate 100 to cover the gate pattern 125. The first insulating interlayer 200 may be formed by a chemical vapor deposition (CVD) process.

Referring to FIG. 11b, a contact plug 127 is formed in the first insulating interlayer 200 and is connected to the drain region 114. A bottom electrode 132 is formed on the first insulating interlayer 200 and is connected to the contact plug 127. A data storage layer 134, a switching layer 136 and a top electrode 138 are sequentially formed on the bottom electrode 132. The bottom electrode 132, the data storage layer 134, the switching layer 136 and the top electrode 138 may be formed by a chemical vapor deposition (CVD) process or a physical vapor deposition (PVD) process. In some embodiments, the switching layer 136 is formed between the bottom electrode 132 and the data storage layer 134. In other embodiments, the switching layer 136 is formed between the bottom electrode 138 and the data storage layer 134, and between the top electrode 138 and the data storage layer 134.

The switching layer 136 may include one or more materials such as aluminum (Al), magnesium (Mg) and/or tantalum (Ta). The data storage layer 134 may include a transition metal oxide in which the transition metal is nickel (Ni), niobium (Nb), titanium (Ti), zirconium (Zr), hafnium (Hf), cobalt (Co), iron (Fe), copper (Cu), chromium (Cr), or zinc (Zn). The top and bottom electrodes 138 and 132 may independently include materials such as iridium (Ir), platinum (Pt), ruthenium (Ru), tungsten (W), titanium nitride (TiN) and/or polysilicon.

Referring to FIG. 11c, a second insulating interlayer 130 is formed on the first insulating interlayer 200 to cover the top electrode 138. A plate electrode 140 is formed on the second insulating interlayer 130 and is connected to the top electrode 138. It is believed that the bond energy of the material included in the switching layer 136 and oxygen is more than that between the transition metal included in the data storage layer 134 and oxygen. For example, the bond energy of aluminum and oxygen is about 260 KJ/mol, while the bond energy of nickel and oxygen is about 24 kJ/mol. Thus, a portion of the material of the switching layer 136 may be bonded to oxygen in the top portion of the data storage layer 134. As a result, the transition metal that is not bonded to oxygen may be in the upper portion of the data storage layer 134. The activation energy for bonding the material included in the switching layer 136 to oxygen may be supplied from a deposition process of the switching layer 136 and/or a subsequent annealing process.

As an external electric field is applied to the data storage layer 334, a conductive filament may be generated or may disappear. The conductive filament may be generated or may disappear regularly where the transition metal that is not bonded to oxygen on the top portion of the data storage layer 134 is. The range of the set and reset resistances may be shortened by the switching layer 136. Thus, the switching characteristics of a nonvolatile memory device may be improved by providing the switching layer 136.

What is claimed is:

1. A nonvolatile memory device comprising:
   first and second electrodes on a substrate;
   a data storage layer between the first electrode and the second electrode, the data storage layer including (a) a transition metal oxide layer comprising a transition metal oxide and (b) a transition metal layer comprising a transition metal, wherein the transition metal oxide comprises oxygen bonded to a transition metal element that is a match of the transition metal of the transition metal layer; and
   at least one metal oxide layer between the transition metal layer and at least one of the first and second electrodes, the metal oxide layer being in direct contact with the transition metal layer and comprising a metal oxide,
   wherein a bond energy between a metal element and oxygen in the metal oxide layer is greater than a bond energy between a transition metal element and oxygen in the data storage layer, and
   wherein a conductive filament is formed in the transition metal layer when an external electric field is applied to the data storage layer.

2. The nonvolatile memory device of claim 1, wherein the metal oxide layer comprises aluminum (Al).

3. The nonvolatile memory device of claim 2, wherein the at least one metal oxide layer includes (i) a first metal oxide layer between the data storage layer and the first electrode and (ii) a second metal oxide layer between the data storage layer and the second electrode.

4. The nonvolatile memory device of claim 2, wherein the metal oxide layer is between the data storage layer and the first electrode.

5. The nonvolatile memory device of claim 2, wherein the metal oxide layer is between the data storage layer and the second electrode.

6. The nonvolatile memory device of claim 1, wherein the metal oxide layer comprises aluminum (Al) and has a thickness of 5 to 20 angstroms.

7. The nonvolatile memory device of claim 1, wherein the transition metal is selected from the group consisting of nickel (Ni), niobium (Nb), titanium (Ti), zirconium (Zr), hafnium (Hf), cobalt (Co), iron (Fe), copper (Cu), chromium (Cr), and zinc (Zn).

8. The nonvolatile memory device of claim 1, wherein the first and the second electrodes comprise a material selected from the group consisting of iridium (Ir), platinum (Pt), ruthenium (Ru), tungsten (W), titanium nitride (TiN) and polysilicon.

9. The nonvolatile memory device of claim 1, further comprising a switching device connected to the first electrode.

10. The nonvolatile memory device of claim 9, wherein the switching device is a transistor.

11. The nonvolatile memory device of claim 9, wherein the switching device is a diode.

12. A nonvolatile memory device comprising:
    first and second electrodes on a substrate;
    a data storage layer between the first electrode and the second electrode;
    a first metal oxide layer between the data storage layer and the first electrode; and
    a second metal oxide layer between the data storage layer and the second electrode,
    wherein the data storage layer comprises
       a transition metal oxide layer comprising a transition metal oxide;
       a first transition metal layer between the transition metal oxide layer and the first metal oxide layer; and
       a second transition metal layer between the transition metal oxide layer and the second metal oxide layer,
       wherein the transition metal oxide layer and the first and the second transition metal layers comprise the same transition metal,
    wherein a bond energy between a metal element and oxygen in the first and the second metal oxide layers is greater than a bond energy between a transition metal element and oxygen in the transition metal oxide layer.

13. The nonvolatile memory device of claim 12, wherein the first and the second metal oxide layers comprise aluminum (Al).

14. The nonvolatile memory device of claim 12, wherein the first and the second metal oxide layers comprise aluminum (Al) and have a thickness of 5 to 20 angstroms.

15. The nonvolatile memory device of claim 12, wherein the first transition metal layer is in direct contact with the first metal oxide layer, and the second transition metal layer is in direct contact with the second metal oxide layer.

16. The nonvolatile memory device of claim 12, wherein the first and the second transition metal layers comprise a transition metal that is not bonded to oxygen.

* * * * *